(12) United States Patent
Wu et al.

(10) Patent No.: US 11,255,529 B1
(45) Date of Patent: Feb. 22, 2022

(54) BONDING CORNERS OF LIGHT EMITTING DIODE CHIP TO SUBSTRATE USING LASER

(71) Applicant: Facebook Technologies, LLC, Menlo Park, CA (US)

(72) Inventors: Jeb Wu, Redmond, WA (US); Oscar Torrents Abad, Cork (IE); Daniel Brodoceanu, Cork (IE); Pooya Saketi, Cork (IE); Zheng Sung Chio, Cork (IE); Ali Sengül, Zurich (CH)

(73) Assignee: Facebook Technologies, LLC, Menlo Park, CA (US)

(*) Notice: Subject to any disclaimer, the term of this patent is extended or adjusted under 35 U.S.C. 154(b) by 198 days.

(21) Appl. No.: 16/666,839

(22) Filed: Oct. 29, 2019

Related U.S. Application Data

(60) Provisional application No. 62/839,371, filed on Apr. 26, 2019.

(51) Int. Cl.
*F21V 23/00* (2015.01)
*H01L 23/00* (2006.01)

(52) U.S. Cl.
CPC ............ *F21V 23/004* (2013.01); *H01L 24/02* (2013.01); *H01L 24/80* (2013.01); *H01L 2224/03552* (2013.01); *H01L 2224/85214* (2013.01)

(58) Field of Classification Search
CPC .... F21V 23/004; F21V 23/003; F21V 23/001; H01L 24/80; H01L 24/02; H01L 2224/85214; H01L 2224/03552; H01L 24/85; H01L 24/01; H01L 24/42; H01L 2224/02; H01L 2224/03001; H01L 2224/03554; H01L 2224/85007; H01L 2224/8521; H01L 2224/8538
See application file for complete search history.

(56) References Cited

U.S. PATENT DOCUMENTS

2021/0050336 A1\* 2/2021 Koo ............... H01L 25/0753
2021/0265327 A1\* 8/2021 Koo ................... H01L 25/13

\* cited by examiner

*Primary Examiner* — Joseph L Williams
*Assistant Examiner* — Jose M Diaz
(74) *Attorney, Agent, or Firm* — Fenwick & West LLP

(57) ABSTRACT

A light emitting diode (LED) chip is bonded to a substrate. The LED chip includes a plurality of electrodes that each corresponds to a contact on the substrate. The plurality of electrodes are exposed to one or more laser beams for coupling the LED chip to the substrate. The laser beams may be directed to one or more edges or corners of the plurality of electrodes, where the edges or corners lie outside emission areas of LEDs on the LED chip.

13 Claims, 9 Drawing Sheets

BONDING CORNERS OF LIGHT EMITTING DIODE CHIP TO SUBSTRATE USING LASER

CROSS REFERENCE TO RELATED APPLICATION

This application claims the benefit of U.S. Provisional Application No. 62/839,371, filed Apr. 26, 2019, which is incorporated by reference in its entirety.

BACKGROUND

This disclosure relates generally to bonding a light emitting diode (LED) chip to a substrate using a laser.

Displays are ubiquitous and are a core component of many wearable electronic devices, smart phones, tablets, laptops, desktops, TVs and display systems. Some example display technologies include Inorganic Light Emitting Diode (ILED) displays and Organic Light Emitting Diode (OLED) displays. Displays can be manufactured by placing LEDs (e.g., red, green, and blue ILED or OLEDs) at each pixel using standard manufacturing techniques, such as a pick and place process. However, certain aspects of a conventional pick and place process may be unsuitable for some applications, such as manufacturing smaller displays for use in devices like smartphones or virtual reality headsets.

SUMMARY

To manufacture a mini and micro LED display device, mini or micro LEDs can be placed onto a substrate and bonded to the substrate using methods such as thermal compression (TC) bonding, eutectic bonding and conductive glue bonding to secure electrodes of the mini and micro LEDs onto contacts on the substrate. However, when heat is applied to the LEDs using TC bonding to couple the LEDs to the contacts on the substrate, there can be heat exposure to emission areas of the LEDs which can cause damage to the LEDs. Heating the emission areas can cause a reduced efficiency in light emission and increase a likelihood of having defective LEDs on the display device and cause shorter lifetime of the display device.

Embodiments relate to bonding one or more edges or corners of an electrode of a LED chip onto a substrate using a laser. Laser beams are applied to bonding positions on edges or corners of the electrode of the LED while the LED chip is placed on the substrate. By applying the laser beams to the edges or corners of the electrode, substantial portions of emission areas of the LEDs are not exposed to the laser beams, reducing the risk of damaging the LEDs.

Figure 1A:
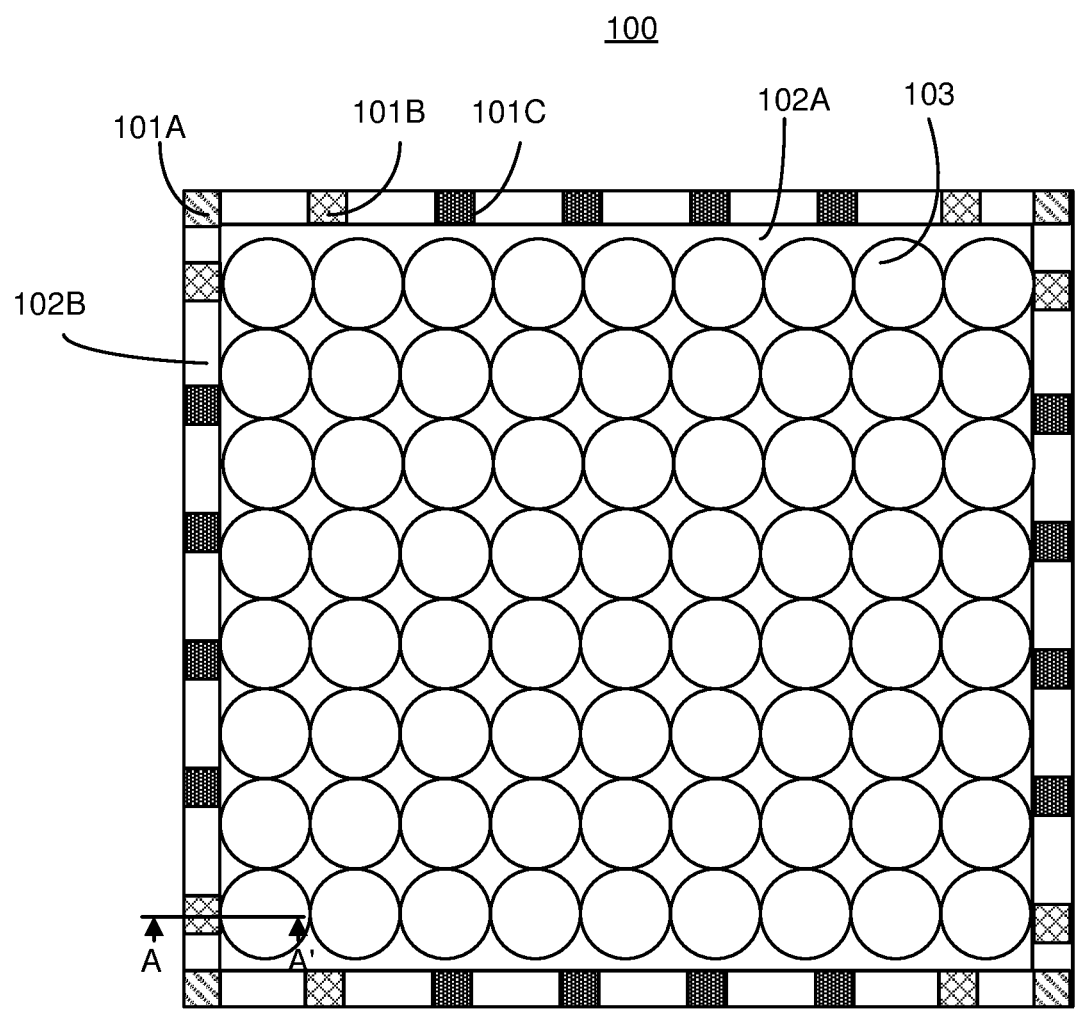
FIG. 1A is a plan view of an LED chip, in accordance with an embodiment.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Embodiments relate to a method of bonding LEDs onto a substrate by directing lasers at edges or corners of electrodes surrounding emission areas of the LEDs. The electrodes of the LEDs are placed on the contacts of the substrate followed by exposure of the edges or the corners of the electrodes of the LEDs. The lasers do not penetrate through the emission areas of the LEDs, and therefore, reduce or prevent deterioration of the emission areas of the LEDs, which may be caused by the bonding process.

FIG. (FIG.) 1A is a plan view of an LED chip 100, in accordance with an embodiment. The LED chip 100 has a display area 102A and an edge area 102B surrounding the display area 102A. The display area 102A includes, among others, an array of LEDs 103. The array of LEDs 103 may be arranged into rows and columns, and each LED 103 has a light emission area from which light is emitted.

In some embodiments, the LEDs 103 may be microLEDs. In some embodiments, the feature size of the microLEDs (e.g., the diameter) may be below 50 The LEDs 103 may be one of many microLEDs of an array on the LED chip 100, with the pitch (e.g., spacing between microLEDs) ranging from sub-micrometers to tens of micrometers. In other embodiments, the LEDs 103 may be miniLEDs with diameters ranging between 50 µm to 200 µm or monolithic LEDs. In one embodiment, all of the LEDs 103 on the LED chip 100 correspond to a same color and emit light of the same color in the display area 102A. In another embodiment, the LEDs 103 in the LED chip 100 vary in color. For example, LEDs 103 in a first row in the display area 102A correspond to a first color (e.g., red), LEDs 103 in a second row correspond to a second color (e.g., green) different from the first color, and LEDs 103 in a third row correspond to a third color (e.g., blue) different from the first and the second colors.

The edge area 102B has testing electrodes 101A, common electrodes 101B, and dummy electrodes 101C in a periphery of the LED chip 100. The testing electrodes 101A, the common electrodes 101B, and the dummy electrodes 101C may be made of conductive material such as copper, copper alloys, aluminum, aluminum alloys, gold and silver. The testing electrodes 101A may be disposed at corners of the LED chip 100 and provide testing signals to the plurality of LEDs 103 in the LED chip 100 to test whether the plurality of LEDs 103 are operable. When a testing electrode 101A is applied with a testing voltage that exceeds a threshold voltage, at least one LED 103 on the LED chip 100 connected to the testing electrode 101A is expected to turn on. If one or more of the at least one LED 103 connected to the testing electrode 101A does not emit light responsive to the testing voltage being applied, the one or more of the at least one LED 103 may be identified as defective. Each of the different testing electrodes 101A may be connected to a different set of LEDs 103. The testing electrodes 101A can also be used to detect current leakage in the LED chip 100. When an LED 103 associated with a first testing electrode 101A emits light while a second testing electrode 101A is applied with a testing voltage and no voltage is applied to the first testing electrode 101A, it indicates that there may be current leakage causing the LED 103 to turn on even though the LED 103 should not be receiving any current.

The common electrodes 101B may also be disposed in the edge area 102B. Depending on the type of the LEDs 103 used in the LED chip 100, the common electrodes 101B may be common cathodes or common anodes. In one embodiment, each LED 103 includes a p-electrode and an n-electrode. In other embodiments, each LED may have either of an individual p-electrode but share an n-electrode with other LEDs on the LED chip 100 or have an individual n-electrode but share a p-electrode with other LEDs. The common electrodes 101B are used as common ground (or common voltage source) that power the LEDs 103. Each common electrode 101B is electrically connected to at least one LED 103 in the display area 102A.

The dummy electrodes 101C are contacts used for securing the LED chip 100 onto a substrate 120. The dummy electrodes 101C are not electrically connected to any components on the LED chip 100 and do not carry any signals or current to the LEDs 103. The dummy electrodes 101C are additional contact points at which the LED chip 100 is coupled to a substrate 120 for a stronger attachment between the LED chip 100 and the substrate 120 to improve structural stability.

The locations and the numbers of the testing electrodes 101A, the common electrodes 101B, and the dummy electrodes 101C may be varied. For example, the common electrodes 101B and the dummy electrodes 101C may be disposed in the display area 102A instead of the edge area 102B and there may be additional testing electrodes 101A.

Figure 1B:
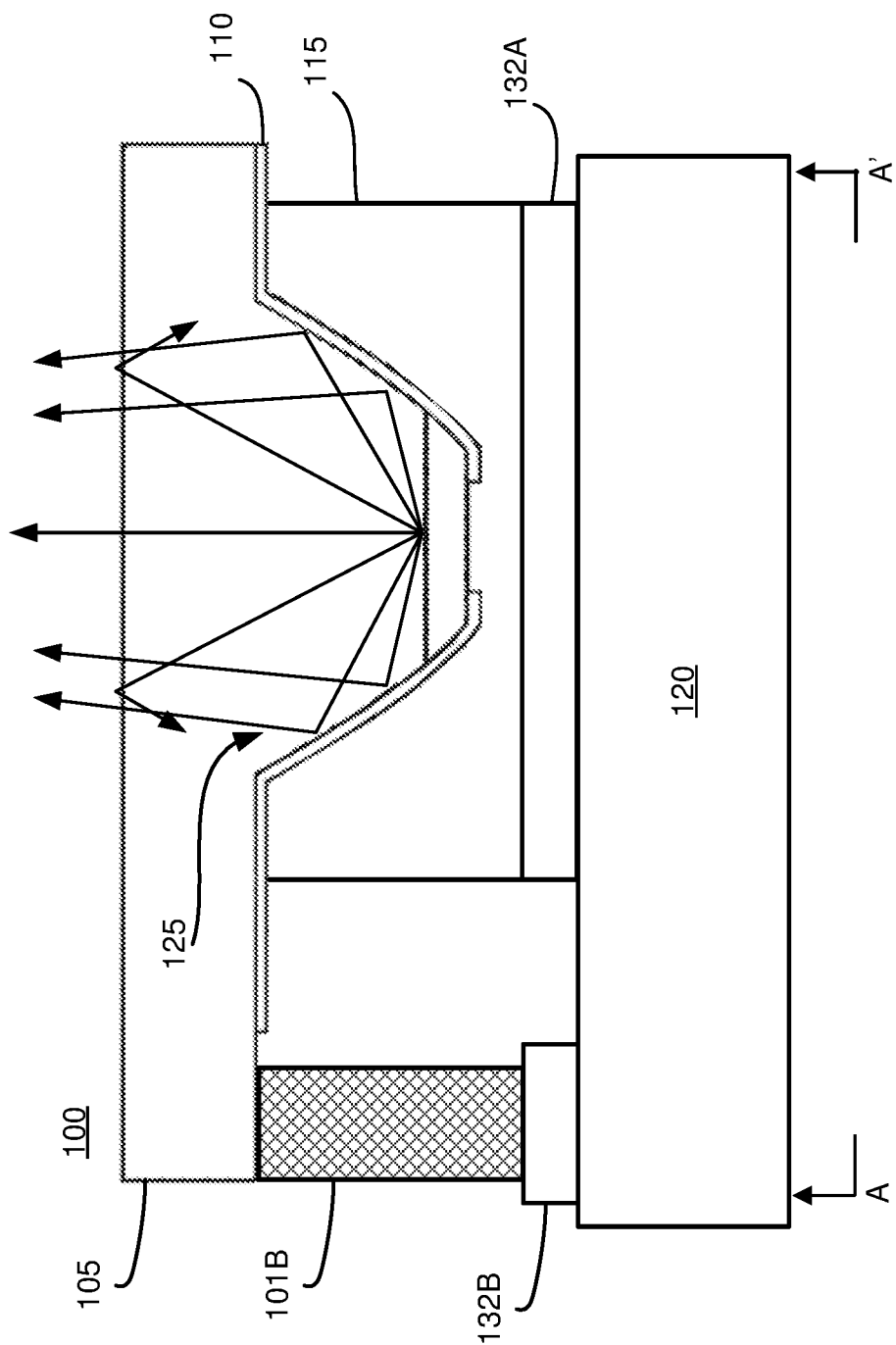
FIG. 1B is a cross sectional diagram illustrating the LED chip of FIG. 1A mounted on a substrate, in accordance with a first embodiment.

FIG. 1B is a cross sectional diagram illustrating the LED chip 100 of FIG. 1A mounted on a substrate 120, in accordance with a first embodiment. FIG. 1B illustrates a cross section of a portion of the display area 102A and the edge area 102B including the common electrode 101B. The portion of the display area 102A shown in FIG. 1B includes one LED 103 of the LED chip 100. The LED chip 100 may include, among other components, a semiconductor layer 105 grown on the substrate, a dielectric layer 110 in contact with a portion of the semiconductor layer 105, an active electrode 115 coupled to a first contact 132A of the substrate 120, and the common electrode 101B coupled to a second contact 132B of the substrate 120.

In some embodiments, the semiconductor layer 105 is a gallium semiconductor layer formed of a semiconductor material such as gallium nitride (GaN), indium gallium nitride (InGaN), gallium phosphide (GaP), gallium arsenide phosphide (GaAsP), aluminum indium gallium phosphate (AlInGaP), or gallium arsenide (GaAs). The type of material used depends on the color of the LEDs 103. In one example, the n-type portion of the semiconductor layer 105 is in contact with the common electrode 101B (e.g., n-electrode), and the p-type portion of the semiconductor layer 105 is in contact with the individual active electrode 115 (e.g., p-electrode). In another example, the p-type portion of the semiconductor layer 105 is in contact with the common electrode 101B (e.g., p-electrode), and the n-type portion of the semiconductor layer 105 is in contact with the active electrode 115 (e.g., n-electrode). The substrate 120 may be a part of an integrated circuit or include an integrated circuit and/or conductive lines that are connected to the first contact 132A and the second contact 132B to provide signals to the common electrode 101B and the active electrode 115 for operating the LED 103.

In some embodiments, the semiconductor layer 105 has an emission area 125 that is shaped like into a mesa. The mesa has a truncated top, on a side opposing the light emitting surface of the semiconductor layer 105. The mesa also has a near-parabolic shape to form a reflective enclosure for light generated within the emission area 125. When seen from a plan view, the active electrode 115 may have a square shape, and the emission area 125 may have a circular shape such that a diagonal dimension of the active electrode 115 is greater than a diameter of the emission area 125. Because the diagonal dimension of the active electrode 115 is greater, the corners of the active electrode 115 lie outside of the emission area 125. In addition to the corners, edges of the active electrode 115 may lie outside of the emission area 125. The parabolic shape of the mesa results in the reflected light being collimated, and improves extraction efficiency by directing the light to be incident at the light emitting surface within a critical angle of the light emitting surface.

In some embodiments, the common electrode 101B connected to one side of the semiconductor layer 105 is connected to the second contact 132B on the substrate 120 and the active electrode 115 connected to another side of the semiconductor layer 105 is connected to the first contact 132A. To cause the LED to emit light from the emission area 125, a voltage difference of at least a threshold voltage of the LED is applied to the common electrode 101B and the active electrode 115 via the substrate 120. The contacts 132 on the substrate 120 is connected to voltage and/or current sources via conductive traces on the substrate 120 and provides signals to the LED.

In some embodiments, the dielectric layer 110 prevents portions of the semiconductor layer 105 from being electrically connected to the active electrode 115. The dielectric layer 110 lies between the portions of the semiconductor layer 105 and the active electrode 115 and prevents direct contact between the portions of the semiconductor layer 105 and the active electrode 115. For example, in the example shown in FIG. 1B, the dielectric layer 110 prevents current from flowing to the semiconductor layer 105 in the curved sides and a portion of the flat region of the emission area 125.

Although only a single emission area 125 is shown in FIG. 1B, additional emission areas 125 are included in the display area 102A. Each of the LEDs 103 in the display area 102A corresponds to an emission area 125 from which light is emitted.

Figure 1C:
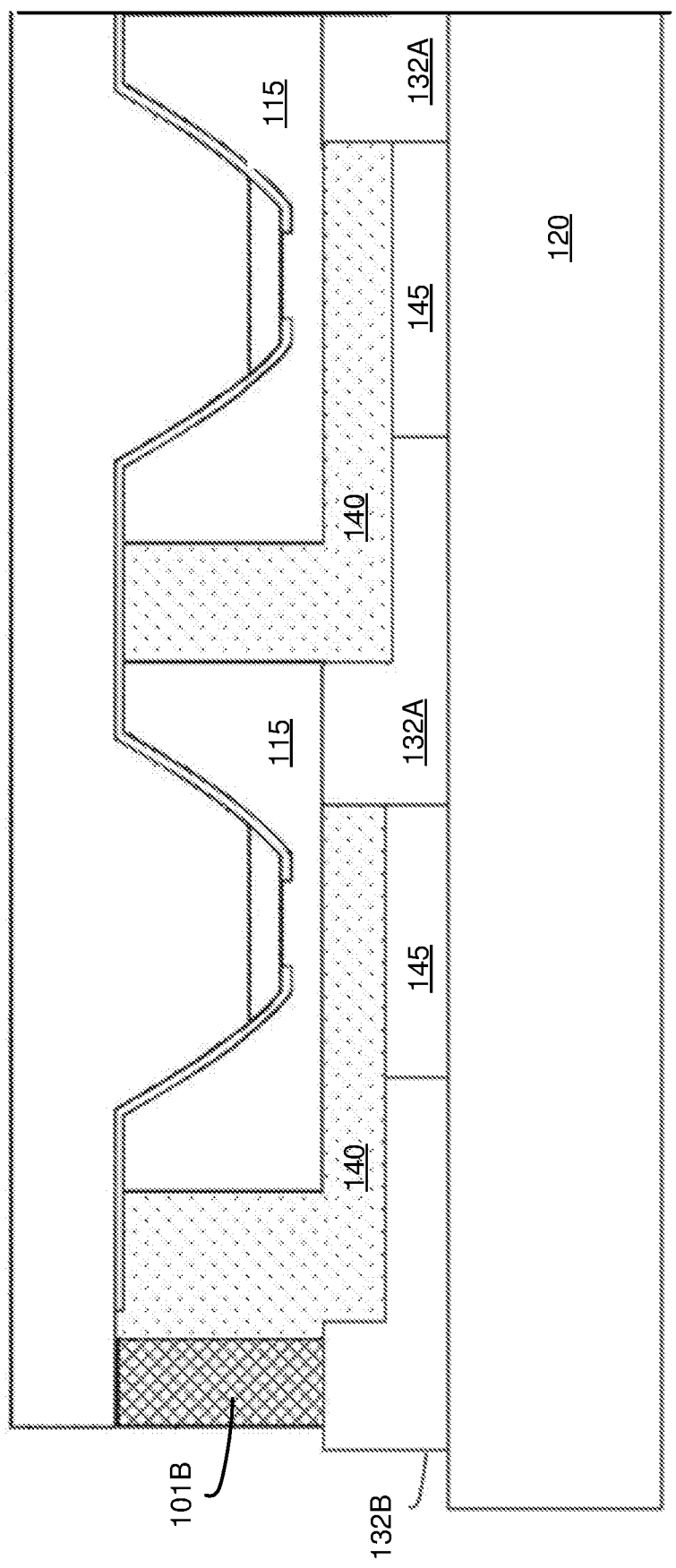
FIG. 1C is a cross sectional diagram illustrating the LED chip of FIG. 1A mounted on a substrate, in accordance with a second embodiment.

FIG. 1C is a cross sectional diagram illustrating the LED chip of FIG. 1A mounted on a substrate, in accordance with another embodiment. FIG. 1C illustrates a cross section of a portion of the display area 102 and the edge area 102B including the common electrode 101B. The portion of the display area 102A shown in FIG. 1C includes a cross section of two LEDs 103 of the LED chip 100.

As shown in FIG. 1C, the active electrode 115 is offset from the contact 132A such that some portions of the active electrode 115 are not in contact with the contact 132A. The contact 132A may have a protruding portion that extends farther away from the substrate 120 compared to remaining portions of the contact 132A. The protruding portion of the contact 132A contacts a portion of the active electrode 115. The portions of the active electrode 115 not in contact with the contact 132A may include the emission area 125 to avoid direct laser exposure to the emission area 125. The offset reduces the risk of damaging the LEDs 103 because the emission area 125 is located away from the path of a laser during the bonding process.

The portions of the active electrode 115 not in contact with the contact 132A may instead be in contact with a passivation layer 140. The passivation layer 140 may include a protective material such as a metal oxide, and may prevent the active electrodes 115 from becoming damaged due to corrosion. The passivation layer 140 may lie in spaces surrounding the active electrodes 115 between adjacent active electrodes 115.

In some embodiments, there may be a gap between the passivation layer 140 and the substrate 120, and the gap may be filled with an underfill layer 145. The underfill layer 145 may provide additional structure when bonding the LED chip 100 to the substrate 120 and reduce effects of thermal expansion mismatch between the substrate 120 and the LED chip 100.

Figure 2:
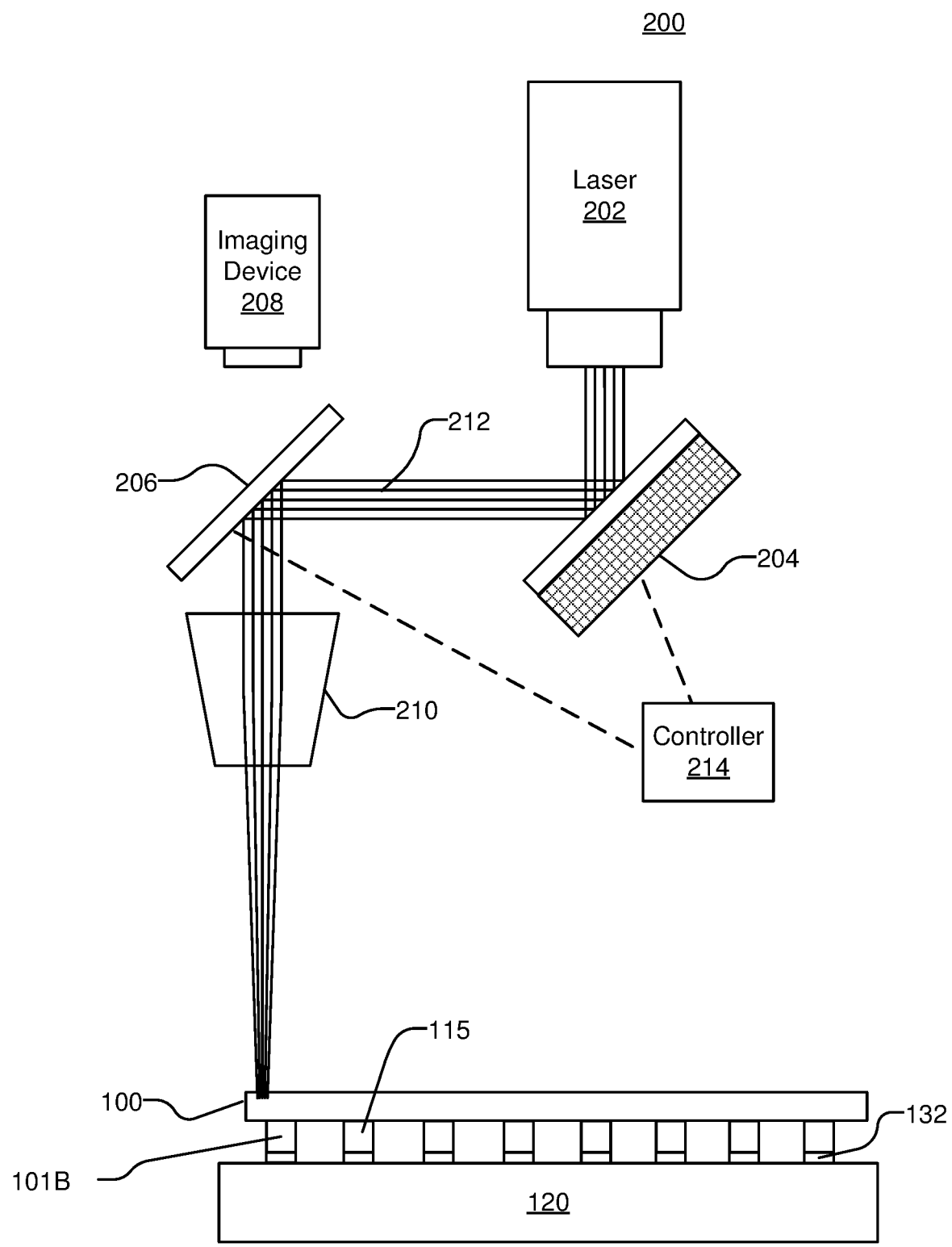
FIG. 2 is a diagram illustrating a system for bonding the LED chip onto the substrate using a laser, in accordance with an embodiment.

FIG. 2 is a diagram illustrating a system 200 for bonding the LED chip 100 onto the substrate 120 using a laser 202, in accordance with an embodiment. The system 200 may include, among other components, a laser 202, an actuated mirror 204, a dichroic mirror 206, an imaging device 208, and a microscope objective 210. The components in the system 200 and the positions of the components for bonding LED chip 100 to the substrate 120 may be varied.

To couple the electrodes on the LED chip 100 (i.e., testing electrodes 101A, common electrodes 101B, dummy electrodes 101C, active electrodes 115) to the contacts 132 of the substrate 120, the laser 202 emits a laser beam 212 that heats the material forming the electrodes and/or the contacts 132. In some embodiments, the heat causes reflow of metals in the electrodes and the contacts 132 and bonds the electrodes to the contacts 132. In other embodiments, heat is applied to the electrodes and/or the contacts 132 until a metal bond is formed at an interface between the electrodes and the corresponding contacts 132. The trajectory of the laser beam 212 is controlled by the actuated mirror 204 and the dichroic mirror 206. First, the laser beam 212 emitted by the laser 202 is directed toward the actuated mirror 204. The actuated mirror 204 has a reflective surface for reflecting the incident laser beam 212 towards the dichroic mirror 206. The actuator mirror 204 is controlled by the controller 214 that provides signals to adjust a position of the actuator mirror 204 such that the laser beam 212 is correctly directed to the dichroic mirror 206.

The dichroic mirror 206 reflects light within a first range of wavelengths and transmits light in a second range of wavelengths different from the first range. In the example shown in FIG. 2, the dichroic mirror 206 is positioned between the laser 202 and the LED chip 100 and positioned between the microscope objective 210 and the imaging device 208. The dichroic mirror 206 reflects the laser beam 212 emitted by the laser 202 towards the LED chip 100 but transmits light used by the imaging device 208 for capturing images. The first range of wavelengths may include a wavelength of the laser beam 212, and the second range of wavelengths may include the visible light spectrum used by the imaging device 208 to capture images. Light reflected from the LED chip 100 passes through the microscope objective 210 and enters the imaging device 208.

The imaging device 208 captures images of the LED chip 100 using light reflected by the LED chip 100. The imaging device 208 may be connected to a processor and/or one or more application-specific circuits that are dedicated to capturing images and processing the captured images. The imaging device 208 is used to align the laser beam 212 to a desired position on the LED chip 100 for accurately bonding the electrodes on the LED chip 100 onto the substrate 120. Although not shown in FIG. 2, the imaging device 208 may be connected to the controller 214 that controls the actuator mirror 204 and the dichroic mirror 206 for directing laser beam to the LED chip 100. The imaging device 208 may also be connected to a stand-alone unit separate from the controller 214 that can communicate with the controller 214 for orienting the adjustable components in the system 200.

In some embodiments, the system 200 is in a fixed position such that the laser beam 212 remains directed to a fixed location, and a stage that the LED chip 100 and substrate 120 are on is moved to align the fixed position with a position on the LED chip 100 to be bonded. In other embodiments, the system 200 shifts while the LED chip 100 and the substrate 120 remain stationary during the manufacturing process.

Figure 3A:
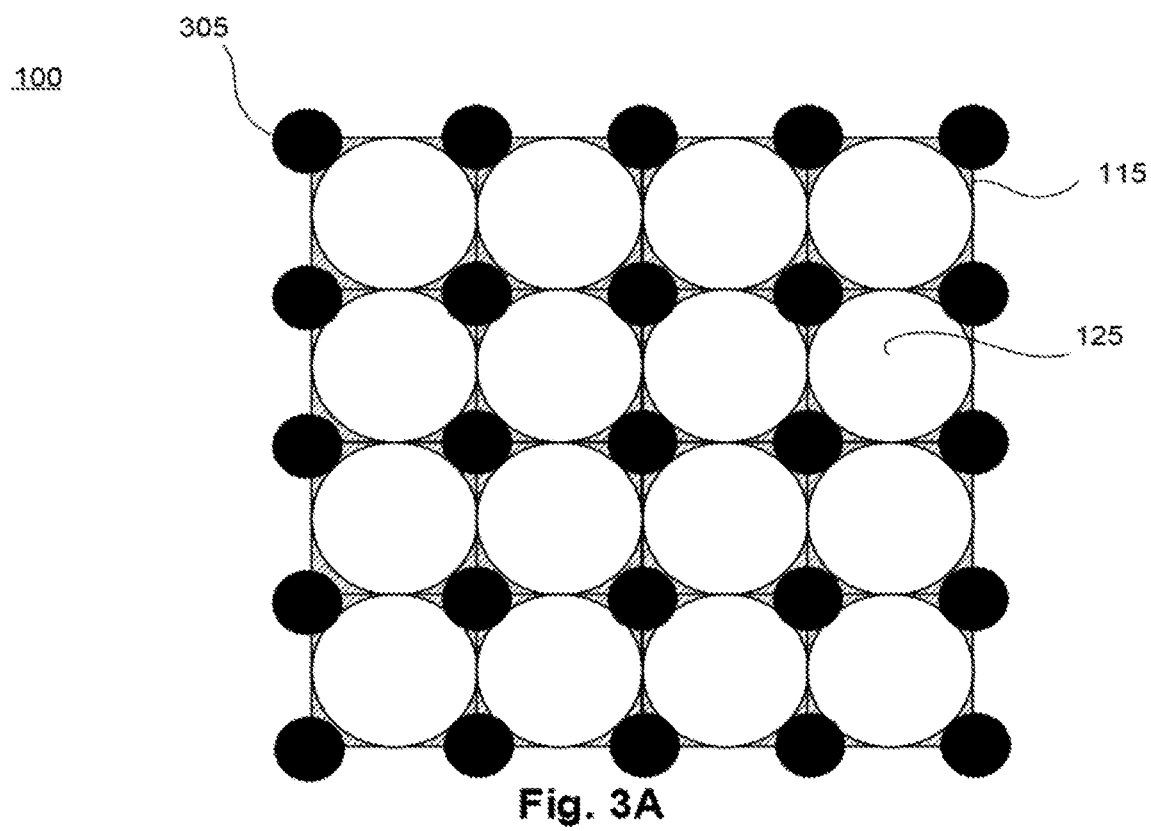
FIG. 3A is a plan view of the LED chip that is bonded to the substrate, in accordance with an embodiment.

FIG. 3A is a plan view of the LED chip 100 that is bonded to the substrate 120, in accordance with an embodiment. In the embodiment shown in FIG. 3A, the LED chip 100 is exposed with the laser beam 212 at bonding positions 305 on active electrodes 115 of the LEDs 103 surrounding the emission areas 125 of the LEDs 103. The bonding positions 305 may correspond to corners of the active electrodes 115 that surround the emission areas 125. In other embodiments, the bonding positions 305 may be located elsewhere along edges of the active electrodes 115 that surrounds the emission areas 125. The bonding positions 305 may be less than 1 µm in diameter.

By localizing laser beam 212 exposure to the bonding positions 305 away from the emission areas 125, thermal stress in the LED chip 100 and risk of damaging the LEDs 103 are reduced. A substantial portion of the emission areas 125 is not exposed to the laser beam 212. In some embodiments, majority of the emission areas 125 is not exposed to the laser beam 212. Additionally, laser beam 212 bonding is performed at room temperature, which reduces issues with coefficient of thermal expansion (CTE) mismatch problems when bonding the LED chip 100 to the substrate 120, for example, using a thermal compressive (TC) bonding. In some embodiments, the localized laser beam 212 may repeat heating the bonding positions 305 in intervals of a few nanoseconds until the bonding position 305 is bonded to its corresponding contact 132. The use of the laser beam 212 to bond the bonding positions 305 located away from the emission areas 125 can contribute to a more reliable and durable connection between electrodes on the LED chip 100 and contacts 132 on the substrate 120.

In some embodiments, the LEDs 103 are bonded onto the substrate 120 using a raster scanning in which the laser beam 212 repeats sweeping across different locations of the LED chip 100 in a raster fashion. As the laser beam 212 sweeps across the LED chip 100, the laser beam 212 bonds the LED chip 100 to the substrate 120 at bonding positions 305. In some embodiments, the laser beam 212 may include multiple beams that are spaced apart by a predetermined width to bond more than one bonding position 305 at once to improve manufacturing efficiency. For example, the laser beam 212 may bond two adjacent bonding positions 305 in a given row simultaneously, and once the two adjacent bonding positions 305 are bonded to the substrate 120, the laser beam 212 shift to a next two adjacent bonding positions 305 that have not been bonded to the substrate 120. The laser beam 212 may also bond multiple bonding positions 305 that are not in the same row. For example, the laser beam 212 may bond four bonding positions 305 corresponding to a same LED 103 simultaneously (e.g., four corners of an active electrode 115).

To avoid wasting resources and time, testing may be performed prior to permanently securing the LED chip 100 to the substrate 120. The LED chip 100 may be positioned such that the active electrodes 115, the testing electrodes 101A, the common electrodes 101B, and the dummy electrodes 101C are aligned with corresponding contacts 132 on substrate 120. Once the LED chip 100 is properly aligned, the LED chip 100 may be applied with a force such that there is sufficient contact between the electrodes on the LED chip 100 and the contacts 132 while the testing is conducted. Because the LED chip 100 is held to the substrate 120 by mechanical contact, the LED chip 100 may easily be removed from the substrate 120 if determined that either the LED chip 100 or the substrate 120 is determined to be defective. In some embodiments, a subset of the electrodes on the LED chip 100 in the edge area 102B may be bonded to the substrate by exposing the subset to the laser beam 212 to hold the LED chip 100 in place.

To test the operability of the LEDs 103 on the LED chip 100, test voltages may be sequentially applied to testing electrodes 101A along the edges of the LED chip 100. An optical device (e.g., imaging device 208) is used to capture images of the LED chip 100 to determine which LEDs 103 are operational responsive to applying the test voltages. The optical device may be connected to a controller that determines whether LEDs properly emit light or emit light above a threshold brightness. If not, the LEDs 103 are identified as defective.

Based on the testing, the controller may determine whether to proceed with bonding the LED chip 100 to the substrate 120. After the testing, the optical device may determine whether the LED chip 100 satisfies a set of criteria representing a threshold operability of the LED chip 100. For example, the criteria may require that at least a threshold number of LEDs 103 on the LED chip 100 are operational, no two LEDs 103 within a threshold distance of each other are not operational, no LED 103 is always on, and the like. If the LED chip 100 does not satisfy the set of criteria, the LED chip 100 may be discarded before being bonded to the substrate.

Figure 3B:
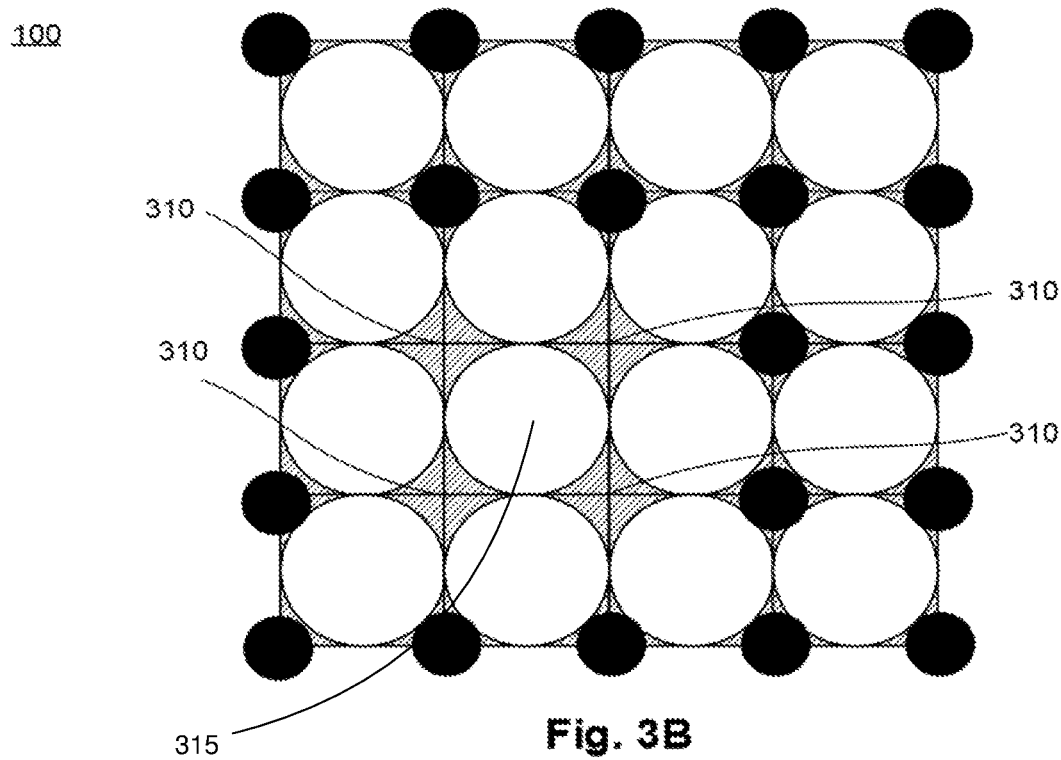
FIG. 3B is a plan view of the LED chip bonded to a substrate at selective corners of an LED, in accordance with an embodiment.

FIG. 3B is a plan view of the LED chip 100 that is bonded to a substrate 120 at selective corners of an LED 315, in accordance with an embodiment. If the controller determines that the LED chip 100 satisfies the threshold operability, the controller determines which bonding positions 305 to be exposed to the laser beam 212. In some embodiments, the laser beam 212 may be projected sequentially onto electrodes of the LED chip that correspond to operational LEDs 103. If it is determined that the LED 315 is defective, one or more positions 310 corresponding to the LED 315 may not be applied with the laser beam 212. For example, as shown in FIG. 3B, all four corners of the defective LED 315 are not applied with the laser beam 212. In other examples, one or more bonding position 305 of the defective LED 315 may be bonded to the substrate 120.

Figure 4A:
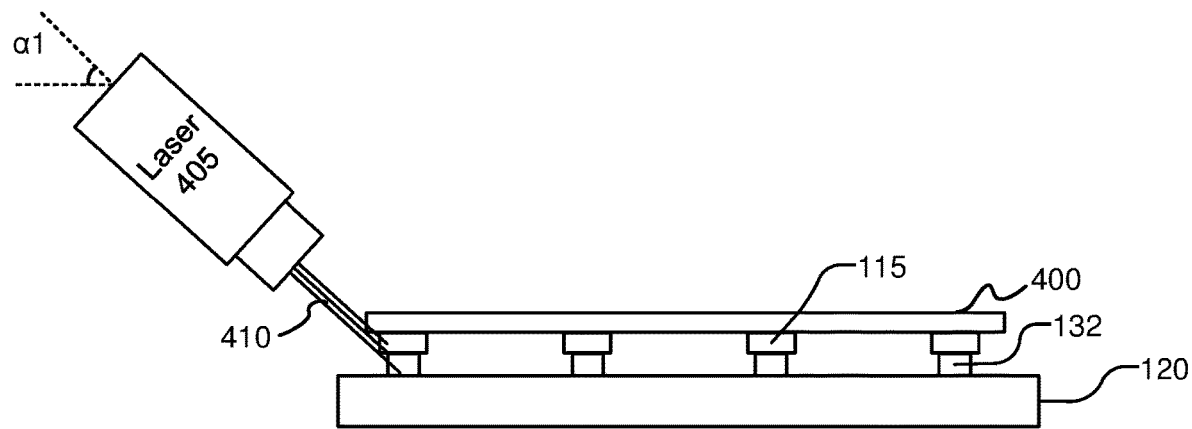
FIG. 4A is a diagram illustrating bonding a LED chip onto a substrate using a laser tilted at a first angle relative to the substrate, in accordance with an embodiment.

FIG. 4A is a diagram illustrating bonding a LED chip 400 onto a substrate 120 using a laser 405 tilted at a first angle α1 relative to the substrate 120, in accordance with an embodiment. In some embodiments, contacts 132 on the substrate 120 may be smaller in surface area than electrodes (e.g., active electrodes 115, testing electrodes 101A, common electrodes 101B, dummy electrodes 101C) on the LED chip 400. When the contacts 132 are smaller in surface area than electrodes on the LED chip 400, it may be advantageous to tilt the laser 405 to avoid directing a laser beam 410 to the emission area 125.

In some embodiments, the laser 405 applies the laser beam 410 to centers of electrodes disposed in the edge area 102B since there is no risk of damaging the active area 125 for these regions at an angle perpendicular to the substrate 120. However, for the active electrodes 115, the laser 405 may be tilted at a first angle α1 relative to the substrate 120 to avoid exposing the emission areas 125 with the laser beam 410. Because the laser 405 is tilted relative to the substrate 120, the laser beam 410 may not pass through the semiconductor layer of the LEDs 103. The first angle α1 may be an angle smaller than 90 degrees. The laser 405 may be stationary, and the laser beam 410 emitted by the laser 405 may be oriented at the first angle α1 using components such as an actuated mirror (e.g., actuated mirror 204) and dichroic mirror (e.g., dichroic mirror 206).

Figure 4B:
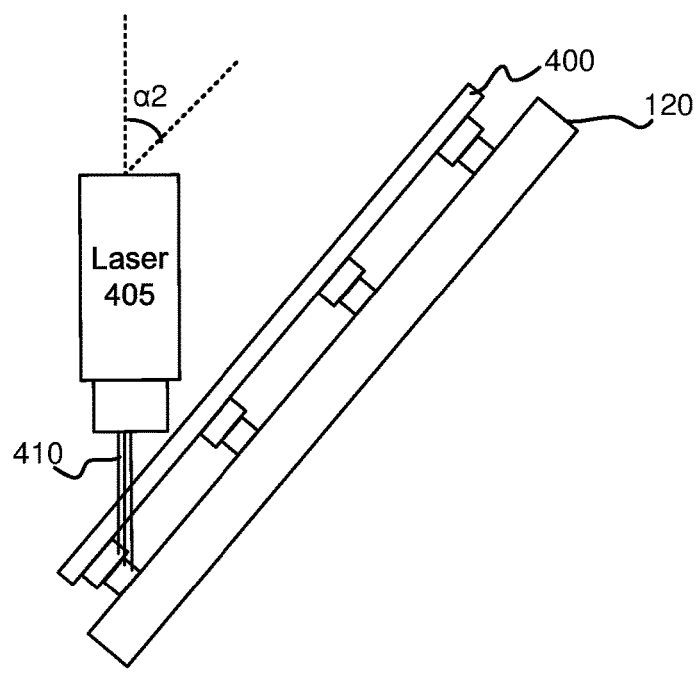
FIG. 4B is a diagram illustrating bonding a LED chip onto a substrate by tilting the LED chip and the substrate at a second angle relative to a laser, in accordance with an embodiment.

FIG. 4B is a diagram illustrating bonding the LED chip 400 onto a substrate 120 by tilting the LED chip 400 and the substrate 120 at a second angle α2 relative to a laser 405, in accordance with an embodiment. During manufacturing, the substrate 120 and the LED chip 400 may rest on an adjustable stage that lies in the path of laser beam 410. The stage may be adjusted such that the substrate 120 and the LED chip 400 are tilted at the second angle α2 less than 90 degrees relative to the laser 405 such that the laser beam 410 may reach the electrodes and the contacts 132.

Figure 5:
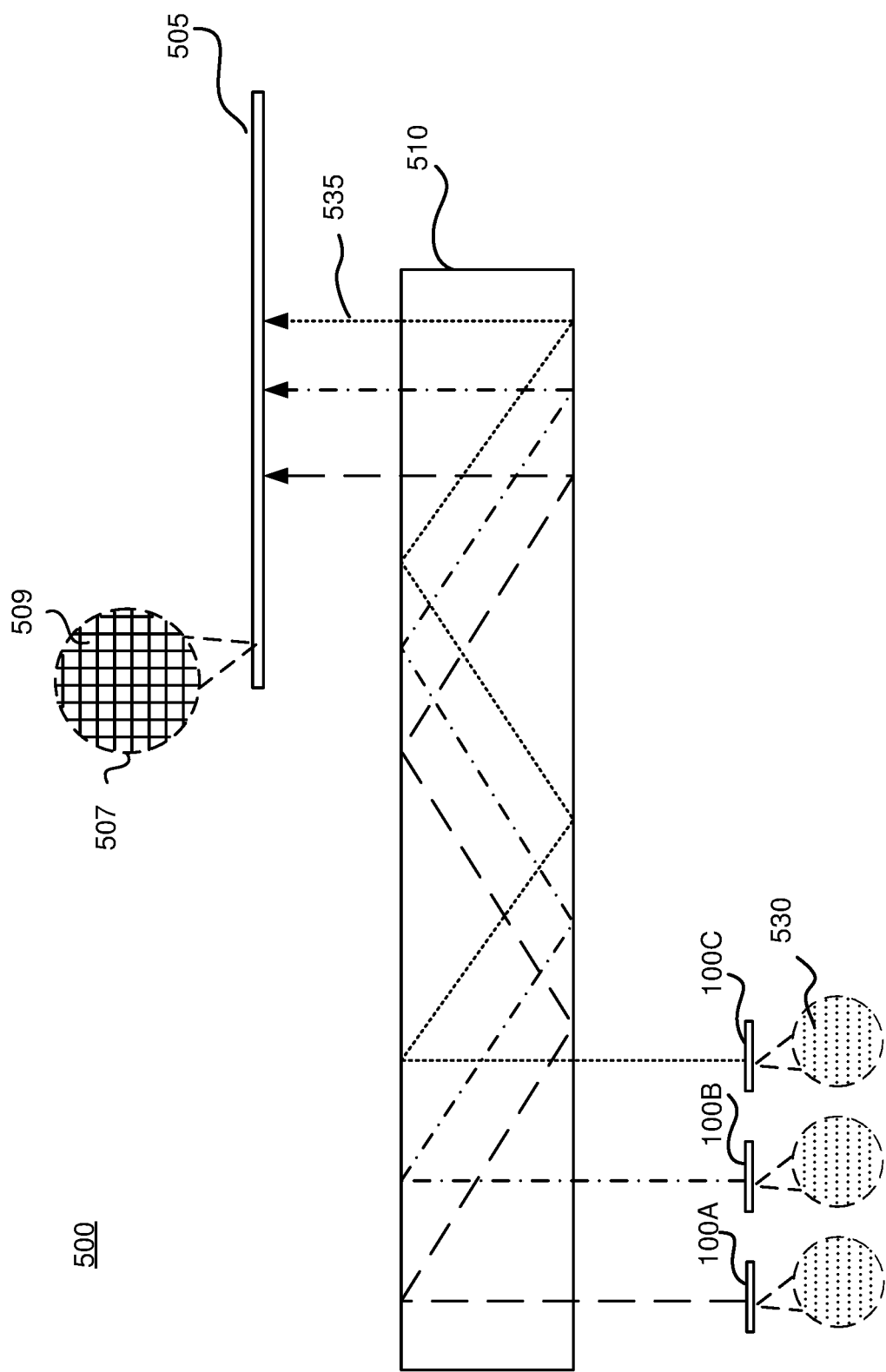
FIG. 5 is a conceptual diagram illustrating projecting light from a plurality of LED chips onto a viewing plane, in accordance with an embodiment.

FIG. 5 is a conceptual diagram 500 illustrating projecting light from a plurality of LED chips 100A, 100B, 100C onto a viewing plane 505, in accordance with an embodiment. In the diagram 500, a first LED chip 100A, a second LED chip 100B, and a third LED chip 100C that each correspond to a different color emit light 535. For example, the first LED chip 100A may correspond to red, the second LED chip 100B may correspond to green, and the third LED chip 100C may correspond to blue. Each of the first LED chip 100A, the second LED chip 100B, and the third LED chip 100C includes a plurality of LEDs 530 that corresponds to pixels 509 on the viewing plane 505. Each pixel 509 may correspond to an LED from the first LED chip 100A, an LED from the second LED chip 100B, and an LED from the third LED chip 100C.

To display an image 507 on the viewing plane 505, light emitted from the first LED chip 100A, the second LED chip 100B, and the third LED chip 100C is directed to an optical waveguide 510. The optical waveguide 510 combines the different colored light from the first LED chip 100A, the second LED chip 100B, and the third LED chip 100C such that when the light exits the optical waveguide 510 and is projected onto the viewing plane 505, the image 507 is projected on the viewing plane 505. The image 507 is made of a plurality of pixels 509, each pixel 509 including a plurality of subpixels. In some embodiments, a number of LEDs on each of the first LED chip 100A, the second LED chip 100B, and the third LED chip 100C may match the number of pixels 509 on the viewing plane 505. In other embodiments, there are fewer LEDs on each of the first LED chip 100A, the second LED chip 100B, and the third LED chip 100C than the number of pixels.

Embodiments of the invention may include or be implemented in conjunction with an artificial reality system. In some embodiments, the first LED chip 100A, the second LED chip 100B, and the third LED chip 100C are components of a device in the artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 6:
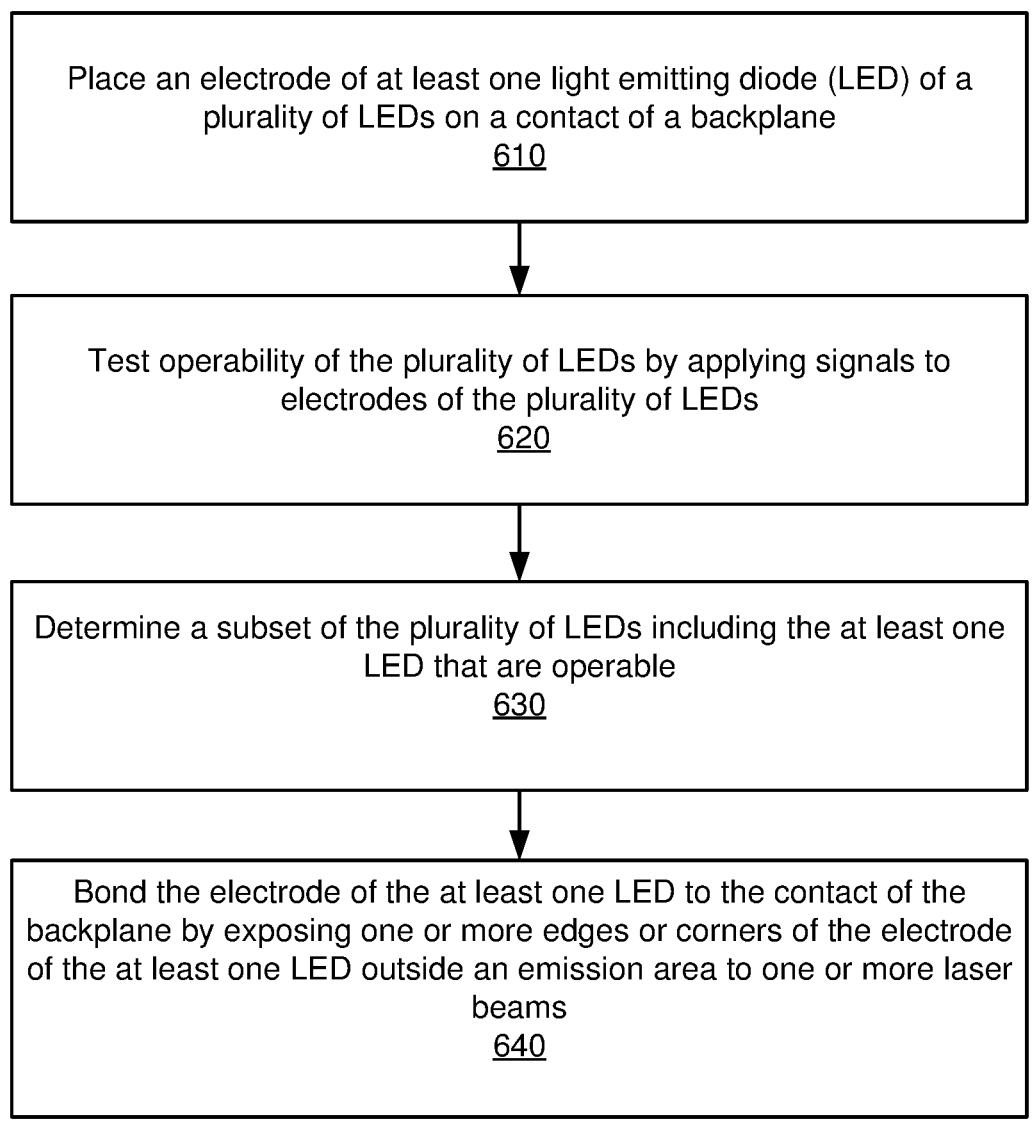
FIG. 6 is a flowchart depicting a process of bonding a LED chip onto a substrate using laser, in accordance with an embodiment.

FIG. 6 is a flowchart depicting a process 600 of bonding a LED chip onto a substrate using laser, in accordance with an embodiment. An electrode of at least one light emitting diode (LED) of a plurality of LEDs is placed 610 on a contact of a substrate. The at least one LED may be in a display area of the LED chip, where the display area is surrounded by an edge area. The electrode of the at least one LED may be an active electrode in the display area.

The operability of the plurality of LEDs is tested 620 by applying signals to electrodes of the plurality of LEDs. In some embodiments, common electrodes of the plurality of LEDs may be in the edge area while the active electrodes of the plurality of LEDs are in the display area.

After applying the signals, a subset of the plurality of LEDs including the at least one LED that are operable is determined 630. The subset may be determined as operable if the subset emits light of at least a threshold brightness.

The electrode of the at least one LED is bonded 640 to the contact of the substrate by exposing one or more edges or corners of the electrode of at least one LED outside an emission area to one or more laser beams. The one or more edges or corners may be sequentially exposed to the one or more laser beams. In some embodiments, all four corners of the electrode may be exposed to the one or more laser beams, and in other embodiments, at least one corner may not be exposed to the one or more laser beams.

Figure 7:
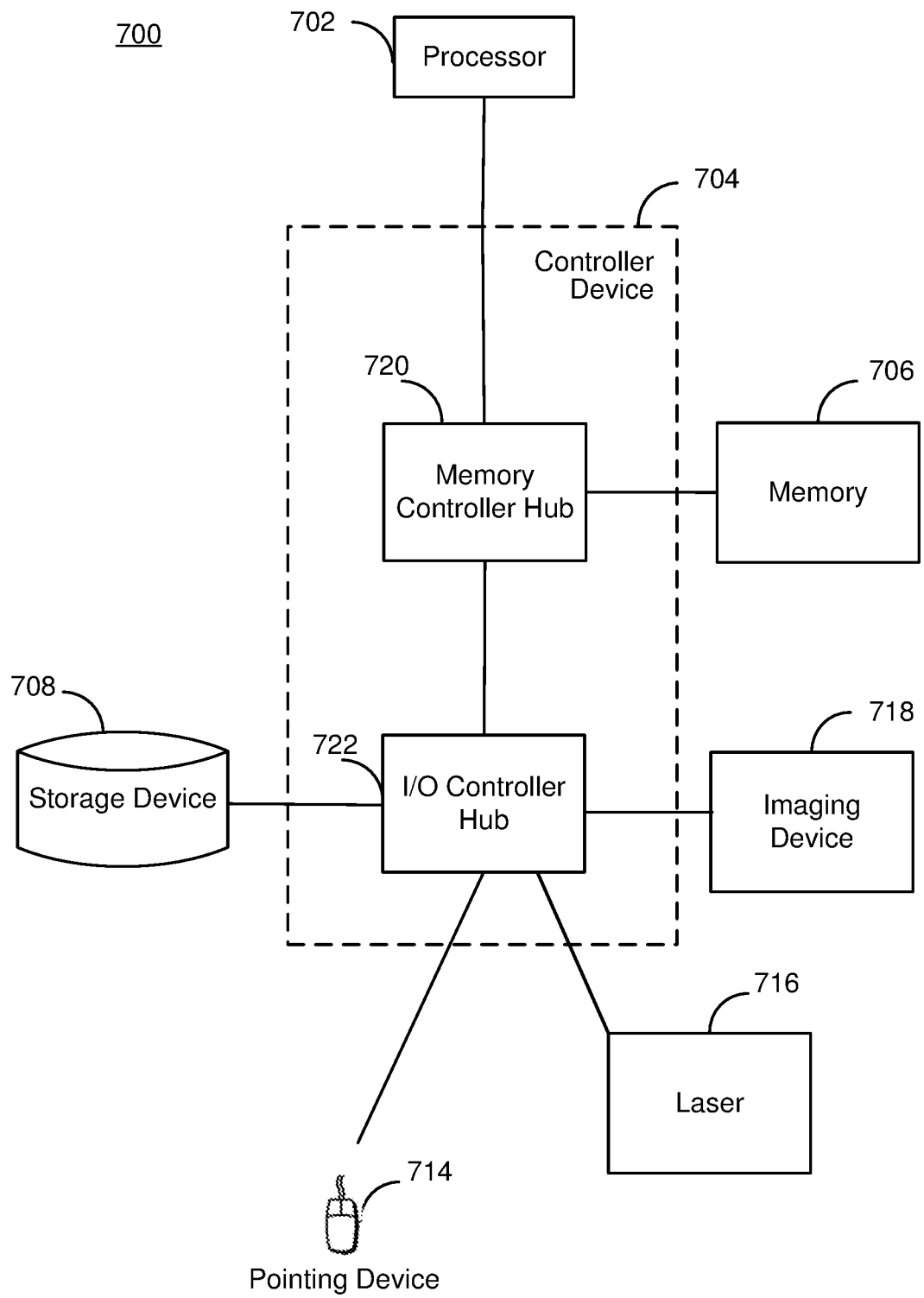
FIG. 7 is a block diagram illustrating a computing system for use in the bonding system, in accordance with an embodiment.

FIG. 7 is a block diagram illustrating a computing system 700 for use in the bonding system of FIG. 2, in accordance with an embodiment. The computer system 700 may be used to control the testing processes or manufacturing processes discussed herein. For example, the process 600 shown in FIG. 6 may be performed under the control of the computing system 700. Illustrated in FIG. 7 are at least one processor 702 coupled to a controller device 704. The controller device 704 includes a memory controller hub 720 and an input/output (I/O) controller hub 722. A memory 706 is coupled to the memory controller hub 720. A storage device 708, a pointing device 714, a laser 716, and an imaging device 718 are coupled to the I/O controller hub 722. Other embodiments of the computer system 700 have different architectures. For example, the memory 706 is directly coupled to the processor 702 in some embodiments.

The storage device 708 includes one or more non-transitory computer-readable storage media such as a hard drive, compact disk read-only memory (CD-ROM), DVD, or a solid-state memory device. The memory 706 holds instructions and data used by the processor 702. For example, the memory 706 may store instructions that when executed by the processor 702, configures the processor to perform the process 600. The pointing device 714 is to input data into the computer system 700. Some embodiments of the computer system 700 have different and/or other components than those shown in FIG. 7.

The I/O controller hub 722 may control trajectory of laser beams emitted by the laser 716 based in part on images captured by the imaging device 718. The imaging device 718 may capture images of a LED chip during testing to determine which LEDs on the LED chip are operational. Based on the captured images, the processor 702 may determine positions on the LED chip to expose to the laser beams for bonding. The imaging device 718 may also be used to align the laser beams to the determined positions during manufacturing stages for bonding the LED chip to a substrate or a different chip. The I/O controller hub 722 may also control a position and intensity of the laser 716 when securing the LED chip.

The computer system 700 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 708, loaded into the memory 706, and executed by the processor 702. For example, program instructions for the method describe herein can be stored on the storage device 708, loaded into the memory 706, and executed by the processor 702.

Although the above embodiments are described primarily with respect to bonding the LED chip to a substrate, the same method of bonding may be used to bond the LED chip to a different chip, bonding a different type of chip onto another chip, or bonding a chip onto a wafer. Furthermore, the same method may be used to bond a wafer with light emitting elements onto another wafer.

The language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
   placing an electrode of at least one light emitting diode (LED) on a contact of a substrate, each of the at least one LED comprising an emission area; and
   bonding the electrode of the at least one LED to the contact of the substrate by exposing one or more edges or corners of the electrode of the at least one LED outside the emission area to one or more laser beams, wherein a substantial portion of the emission area is not exposed to the one or more laser beams.

2. The method of claim 1, further comprising controlling trajectory of the one or more laser beams so that four corners of the electrode of the at least one LED are sequentially exposed to the one or more laser beams.

3. The method of claim 1, wherein the at least one LED is part of an LED chip including a plurality of LEDs.

4. The method of claim 3, further comprising:
testing operability of the plurality of LEDs by applying signals to electrodes of the LED chip;
determining a subset of the plurality of LEDs including the at least one LED that are operable; and
selectively exposing edges or corners of electrodes of the subset of the LEDs to one or more laser beams to bond the electrodes of the subset of the LEDs to the substrate.

5. The method of claim 4, wherein the edges or corners of the electrodes of the subset of the LEDs are sequentially exposed to the one or more laser beams.

6. The method of claim 3, wherein each of the plurality of LEDs emit light of a same color.

7. The method of claim 3, further comprising bonding one or more common electrodes of the LED chip to corresponding one or more contacts on the substrate by exposing the one or more common electrodes of the LED chip to the one or more laser beams.

8. The method of claim 7, wherein the one or more common electrodes are provided at a periphery of the LED chip.

9. The method of claim 1, wherein the one or more laser beams are projected in a direction that forms an angle smaller than 90 degrees relative to a surface of the substrate.

10. The method of claim 1, wherein a portion of the emission area not exposed to the one or more laser beams is larger than another portion of the emission area exposed to the one or more laser beams.

11. A non-transitory computer readable storage medium storing instructions thereon, the instructions when executed by a processor cause the processor to:
place an electrode of at least one light emitting diode (LED) on a contact of a substrate, each of the at least one LED comprising an emission area; and
bond the electrode of the at least one LED to the contact of the substrate by exposing one or more edges or corners of the electrode of at least one LED outside the emission area to one or more laser beams, wherein a substantial portion of the emission area is not exposed to the one or more laser beams.

12. The non-transitory computer readable storage medium of claim 11, storing further instructions that cause the processor to:
control trajectory of the one or more laser beams so that four corners of the electrode of the at least one LED are sequentially exposed to the one or more laser beams.

13. The non-transitory computer readable storage medium of claim 11, wherein the at least one LED is part of an LED chip including a plurality of LEDs.

* * * * *